United States Patent
Yang et al.

(10) Patent No.: US 9,096,428 B2
(45) Date of Patent: Aug. 4, 2015

(54) METHODS AND APPARATUS FOR MEMS STRUCTURE RELEASE

(71) Applicant: Taiwan Semiconductor Manufacturing Company, Ltd., Hsin-Chu (TW)

(72) Inventors: Tai-I Yang, Hsin-Chu (TW); Ming-Tai Chung, Hsin-Chu (TW); Hong-Seng Shue, Zhubei (TW); Ming-Yi Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 44 days.

(21) Appl. No.: 13/790,550

(22) Filed: Mar. 8, 2013

(65) Prior Publication Data

US 2014/0252512 A1    Sep. 11, 2014

(51) Int. Cl.
*H01L 21/00* (2006.01)
*B81C 1/00* (2006.01)
*B81B 3/00* (2006.01)

(52) U.S. Cl.
CPC ........... *B81C 1/00912* (2013.01); *B81B 3/0075* (2013.01)

(58) Field of Classification Search
None
See application file for complete search history.

(56) References Cited

U.S. PATENT DOCUMENTS

| | | | |
|---|---|---|---|
| 6,338,249 B1 * | 1/2002 | Pai et al. | 60/528 |
| 6,576,489 B2 * | 6/2003 | Leung et al. | 438/52 |
| 2012/0306030 A1 * | 12/2012 | Kornilovich et al. | 257/414 |

* cited by examiner

*Primary Examiner* — Sonya D McCall Shepard
(74) *Attorney, Agent, or Firm* — Slater & Matsil, L.L.P.

(57) ABSTRACT

Methods and apparatus for MEMS release are disclosed. A method is described including providing a substrate including at least one MEMS device supported by a sacrificial layer; performing an etch in solution to remove the sacrificial layer from at least one MEMS device; immersing the substrate including the at least one MEMS device in an organic solvent; and while the substrate is immersed in the organic solvent, removing water from the organic solvent until the water remaining in the organic solvent is less than a predetermined threshold. An apparatus is disclosed for performing the methods. Additional alternative methods are disclosed.

20 Claims, 9 Drawing Sheets

METHODS AND APPARATUS FOR MEMS STRUCTURE RELEASE

TECHNICAL FIELD

The present invention relates generally to microelectromechanical systems (MEMS) devices, which are typically micro-structures formed on a substrate such as a semiconductor wafer, the micro-structures may form moving membranes, cantilever beams, movable micro-mirrors or displacement masses, for example, for use in sensing and in analog and digital processing.

BACKGROUND

MEMS devices include micro-structures that move in an operation such as sound or motion sensing. The micro-structures may be formed by selective etch of a silicon, polysilicon or other material that is formed as part of, or later bonded to, a substrate. Membranes, flexible or cantilever beams, inertial masses for gyroscopes, accelerometers, micro-mirrors and other movable micro-structures may be formed for different applications. The micro-structures may be formed with a support in the form of a sacrificial material such as, for example, a nitride or oxide to protect and support the micro-structures during processing. After the micro-structure is complete, the micro-structure must be "released" by removing this sacrificial material. Removal of a sacrificial material is sometimes performed using an etchant in solution. The use of dilute etchant results in water (deionized water) being left in the spaces around and beneath the micro-structure. Application of a solvent may then be used to attempt to remove the water. A spinning step and a hot bake step may be used to remove the residual water that remains after the solvent is applied. However, water molecules sometimes remain on the device even after these process steps, and the residues cause stiction (that is, the MEMS structures do not move freely), structure crash (MEMS micro-structure may collapse on the underlying substrate), and these processes may cause the micro-structure to change shape or be warped, resulting in poor performance and reduced device yield.

As MEMS structures become increasingly important, for example to form MEMS microphones or other sensors for portable consumer devices, the need for efficient and reliable production of these devices continues to increase.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not drawn to scale.

DETAILED DESCRIPTION

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and do not limit the scope of the specification, or the appended claims.

Figure 1:
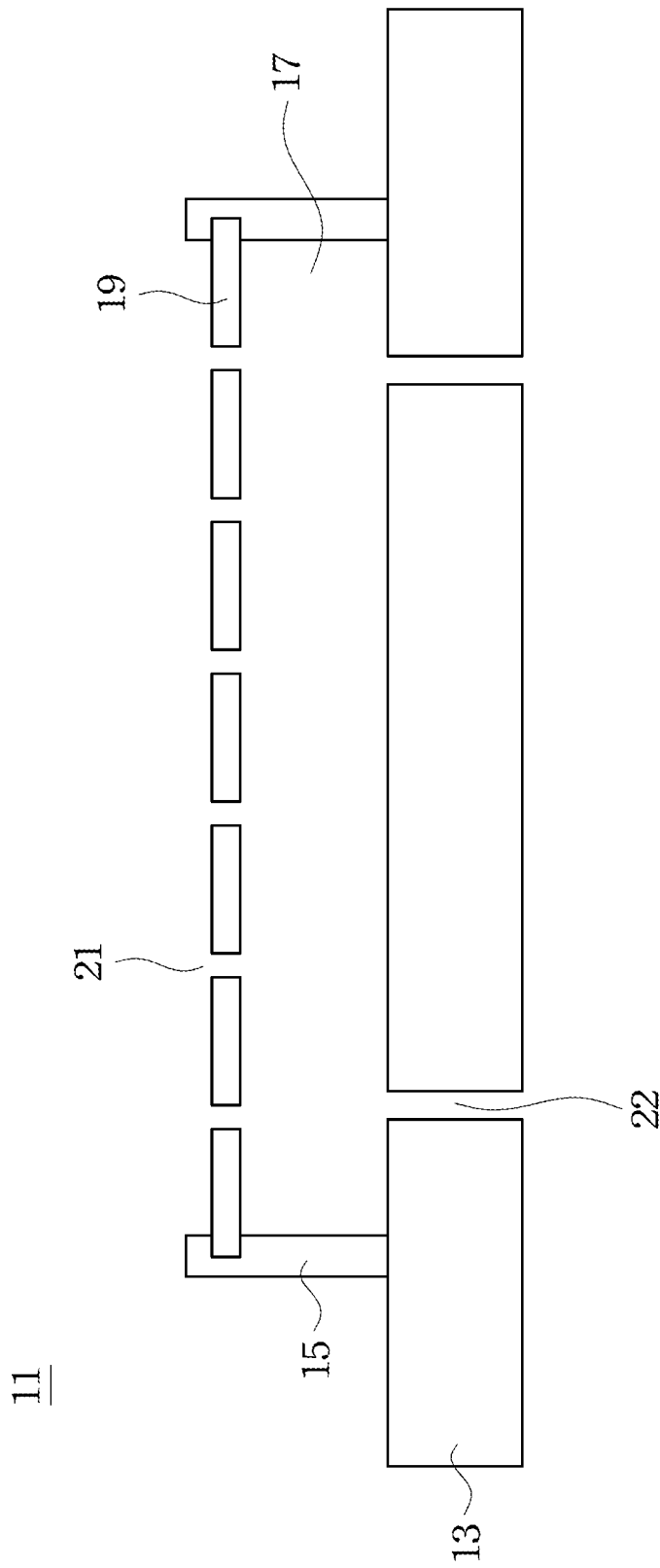
FIG. 1 illustrates in a cross-sectional view an example MEMS micro-structure for use in illustrating the embodiments.

FIG. 1 illustrates, in a simplified cross-sectional view, a device 11 that includes a MEMS micro-structure used to illustrate the embodiments. In this example, a membrane 19 is formed over a substrate 13 for use with the embodiments. Supports 15 hold the membrane 19 above the surface of the substrate 13 and form an air gap 17. In a MEMS microphone application, the finished membrane 19 moves or flexes when sound waves impact the exposed surface of the membrane 19, and a varying capacitance measured between substrate 13 and the membrane 19 provides an electrical signal corresponding to the sound. The illustrative example of FIG. 1 is non-limiting; MEMS micro-structures that may be used with the embodiments may be formed for other applications, as well. Generally, the embodiments are used to release a MEMS micro-structure from a sacrificial material, while preventing or reducing stiction and collapse of the micro-structure that occur in prior approaches.

The membrane 19 may be formed of polycrystalline silicon, for example, or of silicon. The membrane 19 may be deposited and then patterned using conventional semiconductor processes. In an alternative embodiment, a patterned silicon layer (formed, for example, on a wafer) may be bonded to a carrier (as an example, another wafer) using silicon etch, photolithography, wafer bonding and wafer thinning techniques.

Membrane openings 21 are formed to allow for processing as described further below. These membrane openings allow material to move through the membrane 19 into the space of air gap 17 including etchants and solvents as described below. Openings 22 similarly allow for access to and drainage from the air gap 17.

Figure 2:
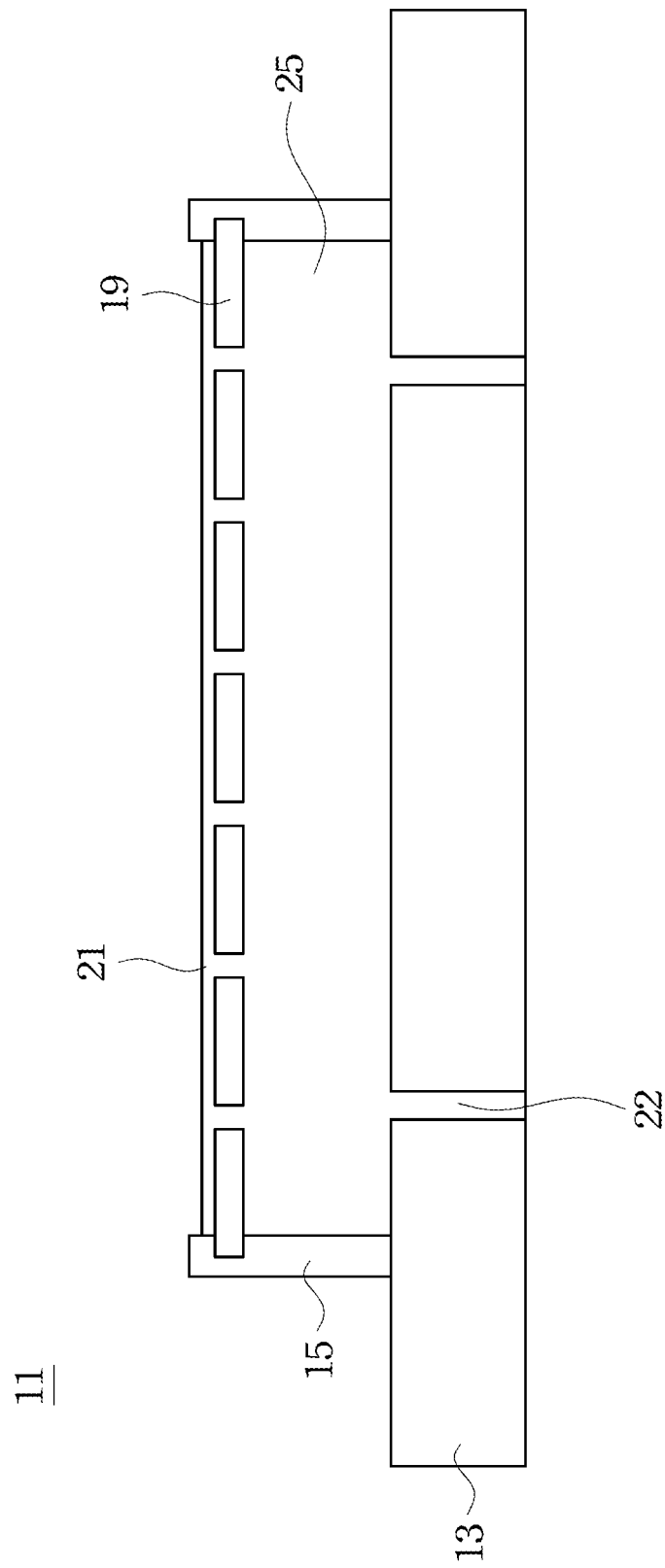
FIG. 2 illustrates in a cross-sectional view the MEMS micro-structure of FIG. 1 and illustrates an intermediate process step.

FIG. 2 depicts, in a cross-sectional view, an intermediate stage in the process used for forming the device 11 of FIG. 1, for use in illustrating an embodiment. In FIG. 2, a sacrificial oxide 25 is shown filling the air gap between the membrane 19 and the substrate 13. The sacrificial oxide 25 may be $SiO_2$, for example. This oxide may be formed prior to the formation of the membrane 19 in an oxide deposition process. The sacrificial oxide 25 is used to provide mechanical support for the membrane 19 during processing. The sacrificial layer must be removed to "release" the membrane 19 so that it may move in operation of the finished device. Alternative embodiments use silicon nitride, for example, in place of oxide 25. Other alternatives such as polyimides are used as alternative embodiments.

Figure 3:
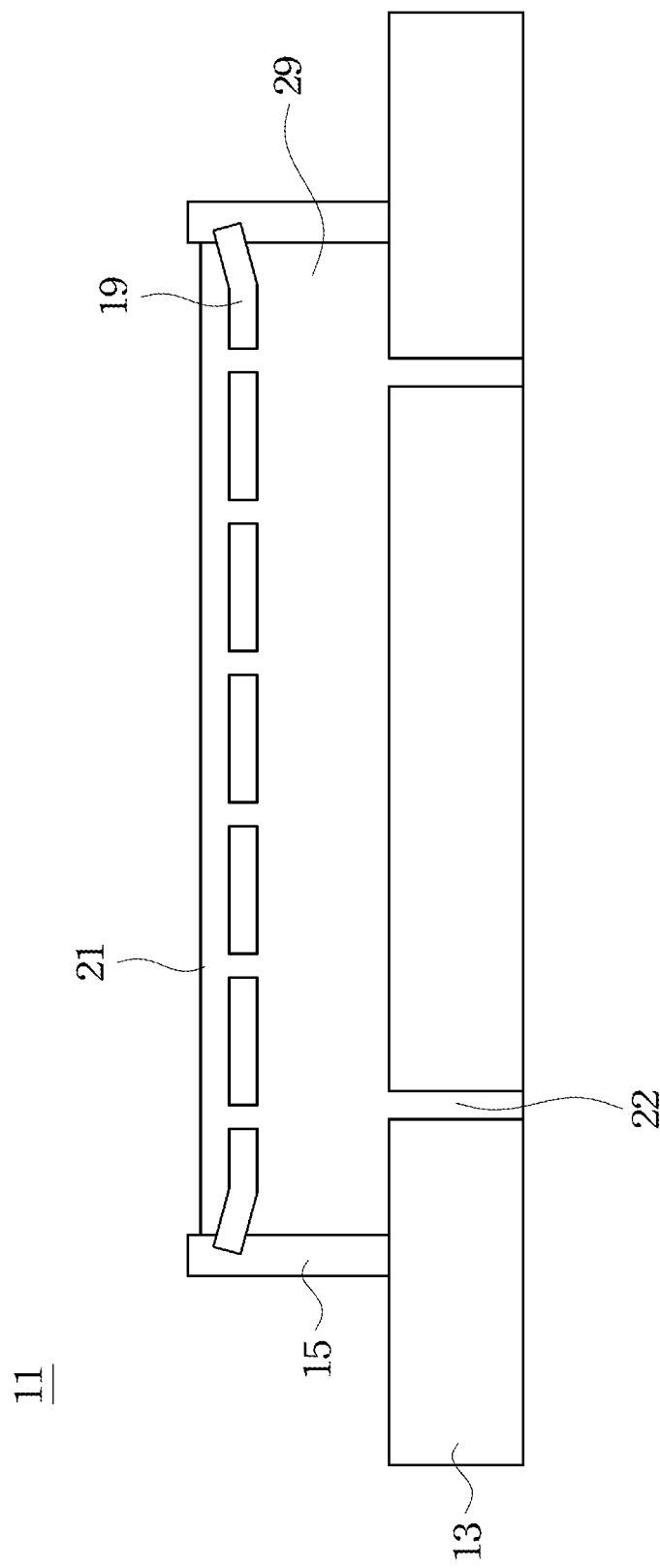
FIG. 3 illustrates in a cross-sectional view the MEMS micro-structure of FIG. 2 and illustrates an additional process step.

In FIG. 3, the device 11 is shown in another cross-sectional view during an etching step. An etchant 29 is shown in the air gap between the membrane 19 and the substrate 13 and is removing the sacrificial oxide 25. The etchant may be, in an embodiment, diluted HF solution or "DHF." DHF may be as little as 1% (1:100 ratio of HF:H2O) and may vary up to 1:1 for concentrated HF solution (49%). Alternatives include, for example, buffered etchants such buffered HF (BHF") or buffered oxide etch, ("BOE") which may include $NH_4$. The etching process is typically an immersion or spray process and the openings 21 and 22 allow the flow of the etching solution 29 to move in and out of the air gap 17. After the etching process is complete, water remains as a residual product, as the etchants are solutions including water.

Because the surface tension of water is relatively high, as much as 72 mN/m, any water that remains on the membrane 19 or in the air gap 17 may cause stiction in the finished membrane 19. Stiction in MEMS devices refers to both adhesion and friction effects, and describes situations where the membrane 19 becomes undesirably attached to the substrate 13 and cannot move, for example.

Stiction can prevent proper operation of the finished MEMS micro-structure device and reduces yield. The water residue from the etching process therefore needs to be removed. Further, once the sacrificial oxide 25 is removed the membrane 19, which is very thin, becomes fragile and subject to mechanical damage in subsequent processes. Membrane 19 may be less than 1 um thick, for example and is supported only at certain points. Spinning or centrifuge approaches which were used in prior drying attempts are known to damage the thin microstructures.

In a method embodiment, an immersion in an organic solvent is used to remove the remaining water from the device 11. In one example embodiment, the solvent used is isopropyl alcohol ("IPA"), sometimes referred to as isopropanol. In an example process, a pure or about 100% IPA solution was used. In an alternative embodiment, a methyl alcohol solvent is used. Further, in an embodiment the immersion is performed while water is continuously removed from the organic solvent until the water remaining is less than a threshold, for example less than 5% in the example of an IPA solvent solution. Put another way in one example, the water is removed until the remaining water is less than about 300 parts per million (PPM). During the solvent immersion, water is removed from the solvent solution by dehydration apparatus in a recirculation process. The embodiment also recycles the solvent, reducing waste, as the solvent is effectively dehydrated it may be reused for additional batches. After dehydrating, the water is removed until the remaining water is less than about 300 parts per million. In another embodiment, real time monitoring is used to determine how much water remains in the solvent and the immersion processing will continue until the water is less than a threshold. The endpoint in this embodiment is determined from the water content. It has been observed that when pure IPA is used as the solvent and the dehydration process removing the water continues until the water is less than or equal to 5%, the resulting membranes in example MEMS devices do not exhibit any stiction. So a threshold of less than 5% remaining water may be selected as a threshold. Other lower thresholds may be used. The MEMS devices, which in an illustrative example are formed on semiconductor wafers, are processed for a period of time such as 30 minutes, more or less. In one example the process continues up to about 60 minutes. The solvent may be heated to enhance its effectiveness. In one embodiment, the IPA is provided at about room temperature, such as 25 degrees Celsius. In alternative embodiments, the IPA 23 may be warmed to up to 60 degrees Celsius. If heating is used, the processing time for removing the water may be reduced.

In an embodiment, a time period for processing is selected through experimental results on sample wafers with MEMS devices that indicate how long the solvent immersion process needs to continue in order to remove the residue from the micro-structure and to ensure the water is removed from the solvent. In another embodiment, real time monitoring is used to determine an endpoint for the process, when the water remaining is less than a threshold % or a threshold "parts per million" level, for example, less than 300 parts per million, the process ends.

Advantageously, the stiction problems of prior approaches are eliminated by using the embodiments where water is removed from the organic solvent. The solvent used should have a surface tension that is lower than water, to effectively disperse the water from the structure.

Figure 4:
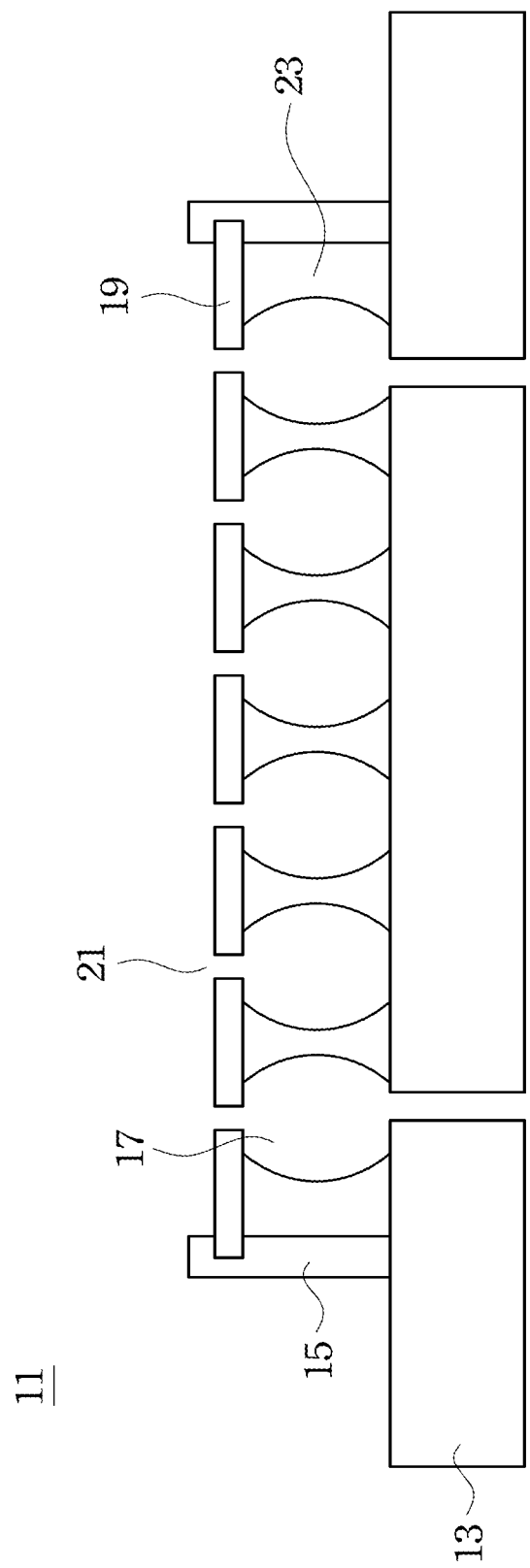
FIG. 4 illustrates in a cross-sectional view the MEMS micro-structure of FIG. 3 and illustrates another process step.

FIG. 4 depicts, in a cross sectional view, the IPA immersion process applied to device 11. IPA solution 23 is shown in the air gap and removes any residual water from the device 11. The IPA has a surface tension of about 21 mN/m, much lower than the surface tension of the water, and the IPA thus disperses the remaining water from the device 11 and the membrane 19.

Figure 5:
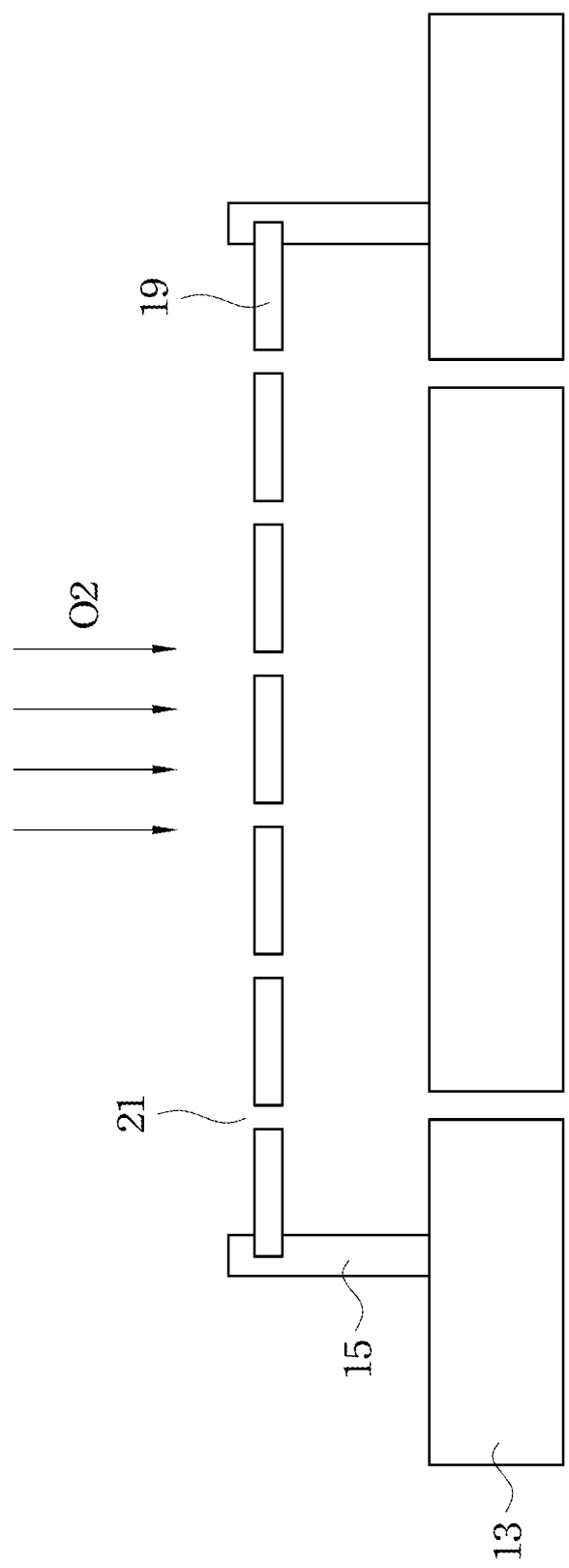
FIG. 5 illustrates in a in a cross-sectional view the MEMS micro-structure of FIG. 4 and illustrates an optional additional process step.

FIG. 5 depicts, in a cross sectional view, the device 11 and illustrates an additional, optional step. In FIG. 5, an $O_2$ plasma treatment is used after the IPA immersion process described above is performed. The plasma treatment is used to remove any remaining IPA residue from the device 11. After this plasma process completes, the micro-structure, membrane 19, is released and is free from water. Stiction, micro-structure collapse or warping defects observed in the prior art are reduced or completely eliminated by use of the embodiments. In the embodiments, no spinning or post process bake is performed, reducing the mechanical stress on the micro-structure, membrane 19, in sharp contrast to the prior approaches.

Figure 6:
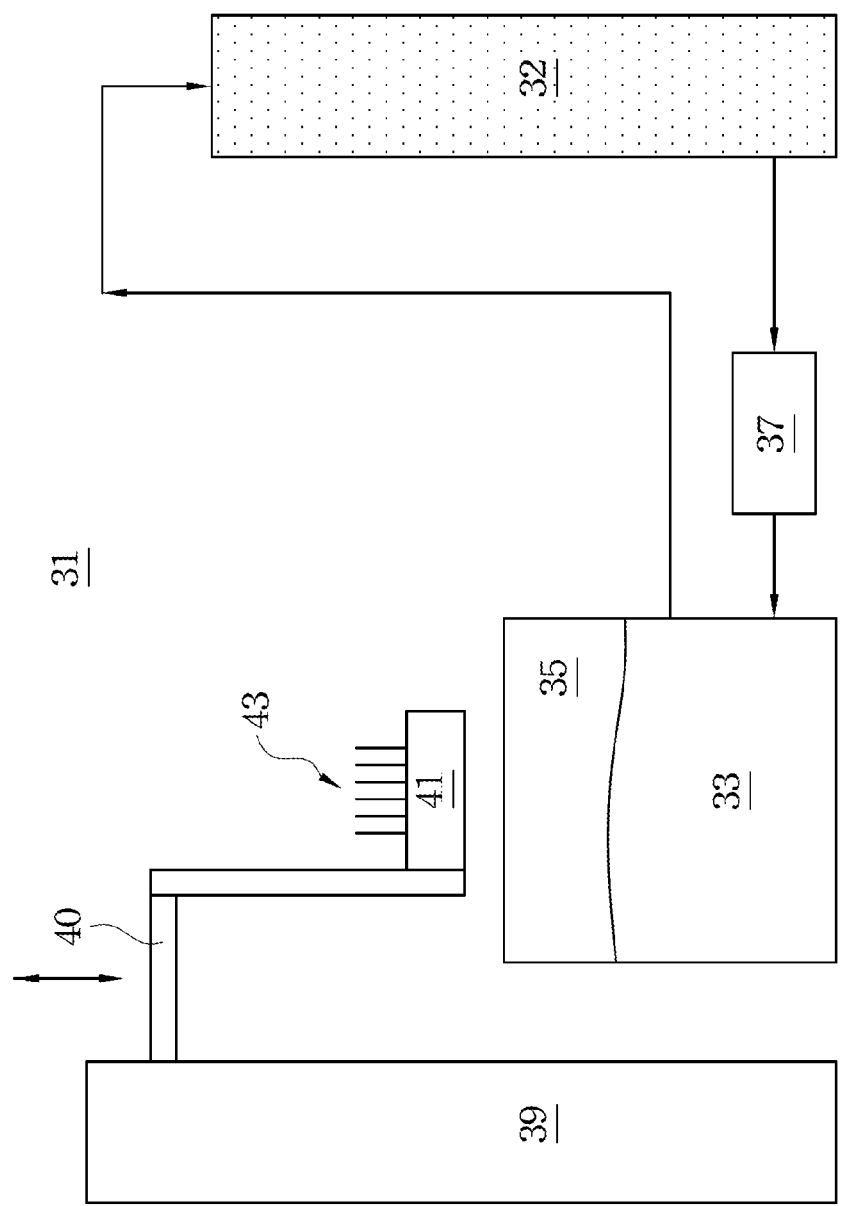
FIG. 6 depicts in a block diagram an embodiment apparatus for performing an embodiment process.

FIG. 6 depicts an apparatus embodiment in a simple block diagram. MEMS release solvent station 31 includes a reactant vessel 35 for containing the solvent, for example IPA, in liquid form. IPA 33 is shown in the vessel 35. A wafer handling station includes an elevator 39 with an arm 40 which travels up and down, and a wafer cassette holder 41, for transporting wafers 43 into, and out of, the vessel 35. 300 mm diameter wafers, or other sized wafers or substrates, may be used. These are disposed in the wafer cassette in a vertical orientation with spacing between them, to allow processing fluids to reach each surface. The wafers 43 each include MEMS microstructures as part of integrated circuit dies formed on the wafers, each wafer includes many thousands of integrated circuit dies.

A dehydration apparatus 32 is provided in a solvent recirculation path. In one embodiment, a molecular sieve device is used. Molecular sieves are used to dehydrate solvents such as acetone, methyl alcohol, IPA and the like that are useful with the embodiments. Molecular sieves are typically filled with zeolite compounds that adsorb water and have carefully controlled pore sizes. The water molecules are smaller than the molecules of solvent, and the large surface area within the pores is accessible only to the water molecules which are effectively removed from the solvent. Molecular sieve devices may remove water from the IPA solution 33 to about 300 parts per million ("PPM"). In another embodiment, dehydration of the IPA is performed by using a dehydrator that applies chemical drying agents, for example. As the recirculating IPA 33 returns to the vessel 35, a real time monitor 37 measures the water remaining in the solvent solution. In an embodiment, an infrared detector is used as the real time monitor sensor. The infrared detector measures absorbance of infrared energy by the solvent and thus indicates the remaining water content. The infrared detector may be accurate up to +/−0.5%, using a wavelength of 1.2 microns. In an embodiment, water content measurements may be taken periodically during the solvent immersion processing and compared to a target threshold level. In another embodiment, real time monitoring is used to continuously indicate the remaining water content in the recirculating solvent. The process may continue for a period of time, until the target threshold is reached, or for a combination of an initial processing time followed by a real time monitoring process, where the endpoint is indicated by a threshold being reached. Manual measurements or periodic automatic measurements may be used in lieu of the real time monitoring. Computer or micro-controller devices may be programmed to automatically end the process when the threshold is reached. Alternatively, an operator may observe the process and end the process when the threshold is reached.

Figure 7:
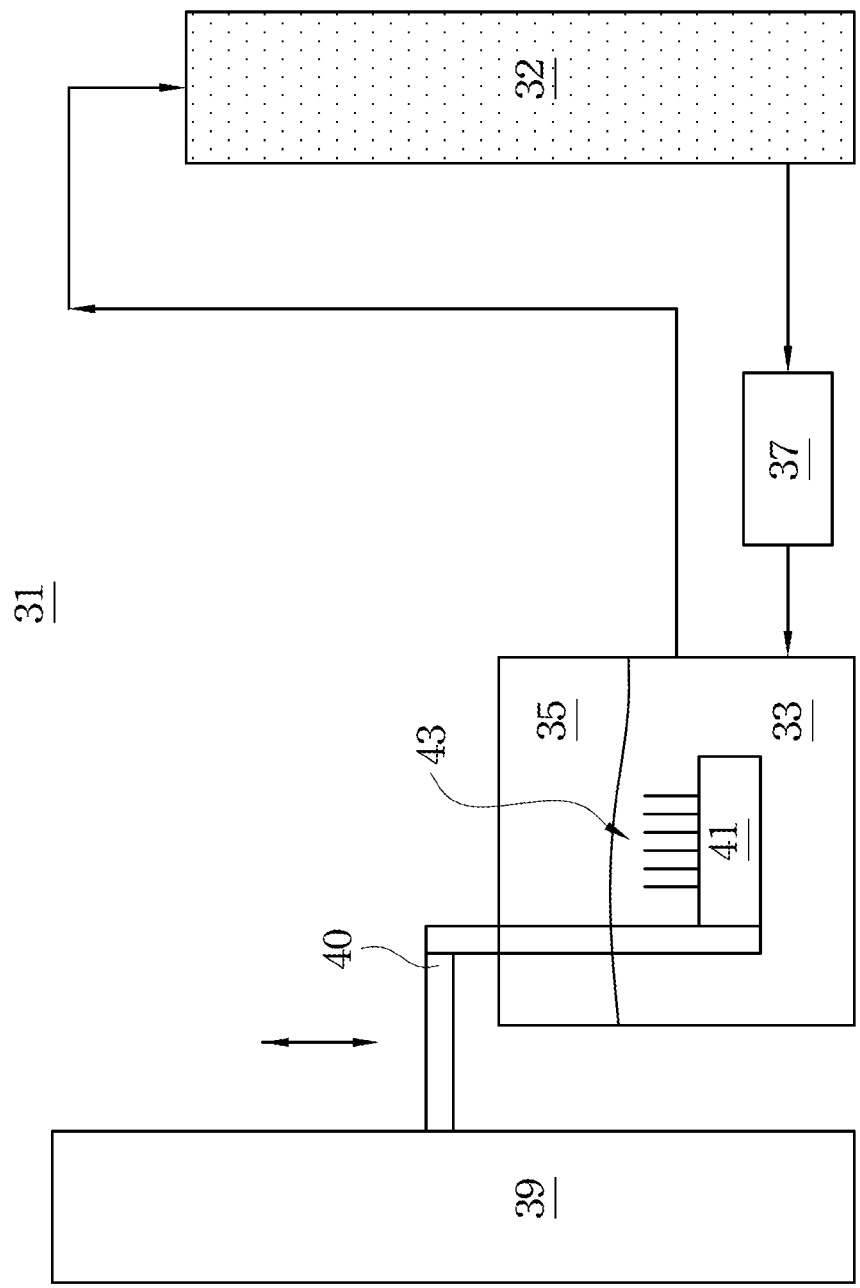
FIG. 7 depicts in a block diagram the apparatus of FIG. 6 and illustrates a process embodiment.

FIG. 7 depicts, in another block diagram, the MEMS release solvent station 31 in an example IPA immersion operation. In FIG. 7, the elevator 39 has been operated to immerse the wafers 43, including the micro-structures which have already been etched in dilute HF, for example, in the solvent 33. The wafers 43 are disposed in wafer carrier 41. The wafers 43 are immersed in the vessel 35 which contains sufficient solvent 33, in this example IPA, to completely cover the wafers 43. A recirculation path includes the dehydration apparatus 32, which is in this example embodiment is a molecular sieve device. Once the wafers 43 are immersed in the solvent 33, the recirculation begins and the water is removed from the solvent continuously. Because the water is almost completely removed by the dehydration apparatus 32, fresh solvent is constantly provided to the wafers 43. Further, the solvent may advantageously be reused for several batches, as it is dehydrated continuously, reducing waste. Real time monitor 37 measures the water content in the returning solvent and as described above, in an embodiment the solvent processing will be continued until a threshold is reached. In an example process, a processing time of about 30 minutes was used. Shorter and longer times may be used, depending on the solvent used and the dehydration apparatus used. The solvent may be heated to enhance its effectiveness, or the process may be performed at room temperature or at about room temperature. For example, the solvent temperature may vary between 25 degrees Celsius and 60 degrees Celsius.

Figure 8:
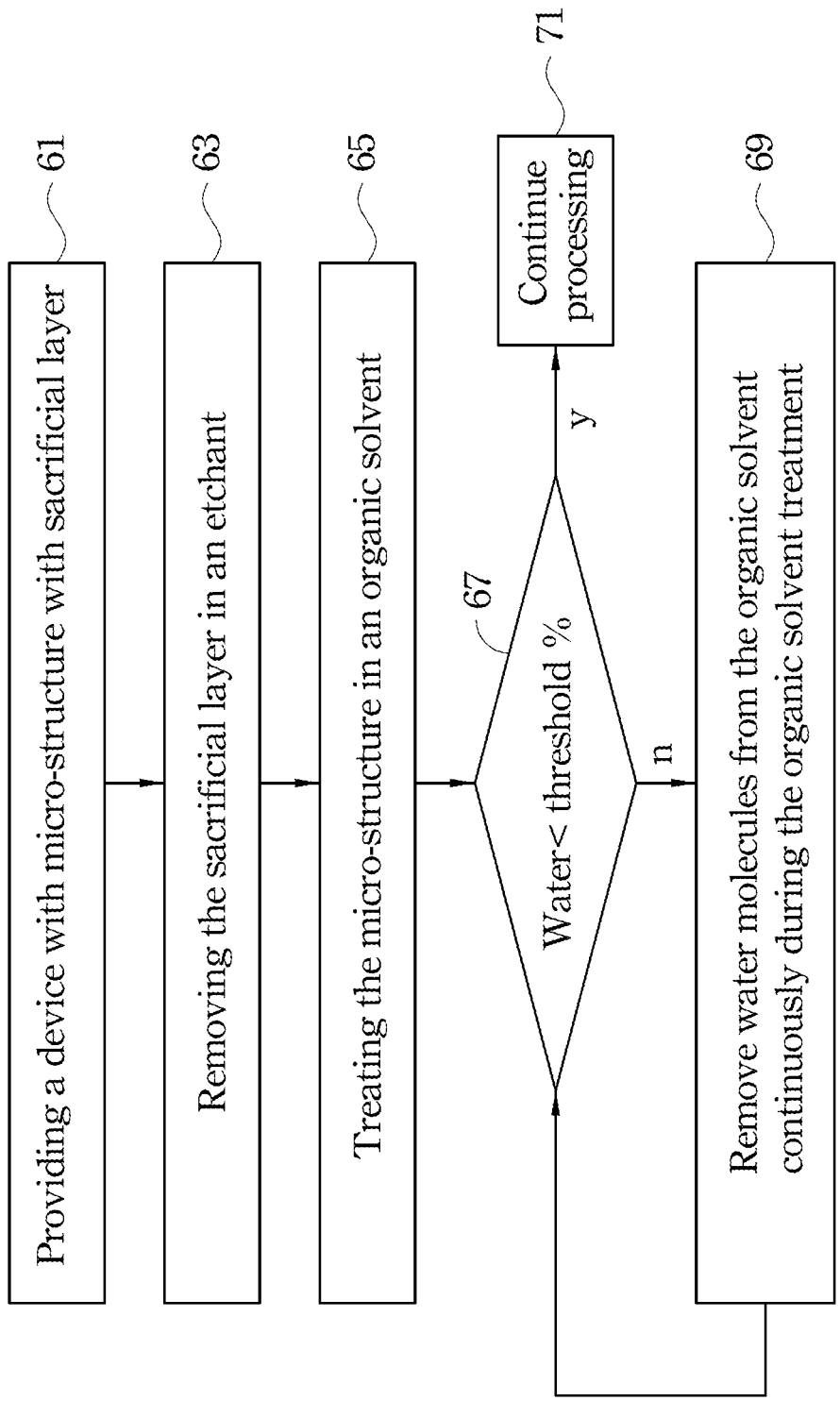
FIG. 8 depicts in a block diagram a process embodiment.

FIG. 8 depicts in a flow diagram an illustrative method embodiment. At step 61, a device is provided with a microstructure supported by a sacrificial layer. For example, a polysilicon microstructure such as a beam, membrane, mirror, is provided overlying a sacrificial oxide or nitride layer. At step 63, an etchant is applied to remove the sacrificial oxide or nitride, such as dilute HF, the etchant includes water. At step 65, the micro-structure is treated in an organic solvent as described above to remove the residue including water that remains from the etching step. In an embodiment, the organic solvent is isopropyl alcohol, or in other embodiments, alternatively methyl alcohol or other organic solvent used to remove water. At step 67, a measurement is made of the water content of the organic solvent. If the water content is less than a predetermined threshold percentage, for example, less than 5%, less than 300 PPM, or less than some other predetermined percentage, such as 3% etc., the organic solvent process ends and device processing continues at step 71. If however, the water content is greater than the threshold at step 67, then as shown in FIG. 8 the process transitions to step 69 and the water molecules are removed from the organic solvent using a dehydration apparatus. As described above, the dehydration may be performed, for example, using a molecular sieve to remove water molecules from the solvent.

Figure 9:
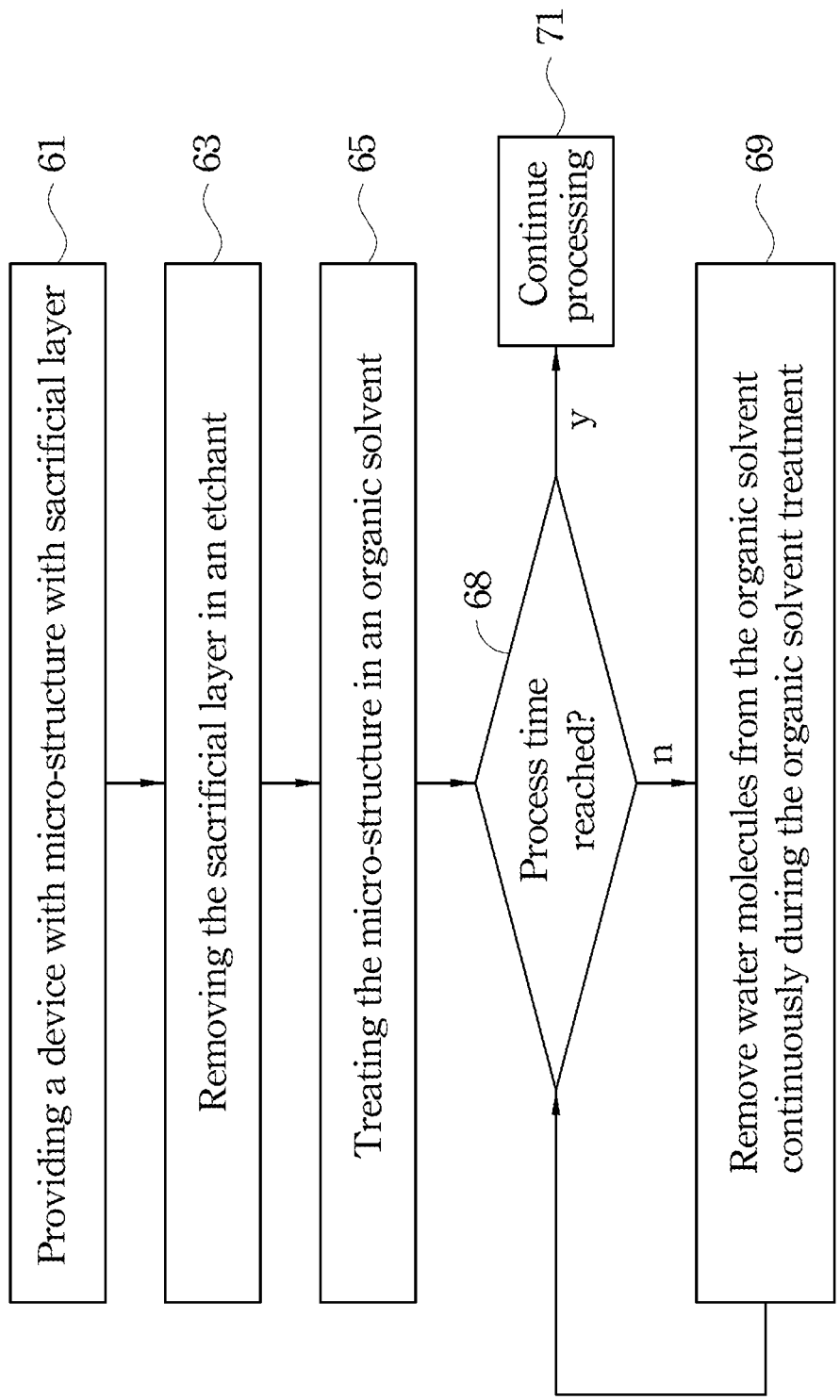
FIG. 9 depicts in a block diagram an alternative process embodiment.

FIG. 9 depicts, in a block diagram, an alternative method embodiment. Many of the steps are the same as those of FIG. 8 and like reference numerals are used. In FIG. 9, at step 61, a MEMS device is provided with a micro-structure supported by a sacrificial layer. For example a polysilicon microstructure such as, a beam, membrane, mirror, is provided overlying a sacrificial oxide or nitride layer. At step 63, an etchant is applied to remove the sacrificial oxide or nitride, such as dilute HF, the etchant includes water. At step 65, the microstructure is treated in an organic solvent as described above to remove the residue including water that remains from the etching step. In an embodiment, organic solvent is isopropyl alcohol, or in other embodiments, alternatively methyl alcohol or other organic solvent used to remove water. At step 68, a process time is used to determine the endpoint. In contrast to the method of FIG. 8, which uses a monitoring approach, in the embodiment of FIG. 9 experimental results are used to determine an adequate process time, and no process monitor is needed. The process continues for a predetermined time that is known, from experimental results, to be sufficient to remove the water from the solvent in the dehydration apparatus. If the process time is complete, the solvent process ends and device processing continues at step 71. If however, the process time is not reached at step 68, then as shown in FIG. 9, the process transitions to step 69 and the water molecules are removed from the organic solvent using a dehydration apparatus. As described above, the dehydration process may be performed, for example, using a molecular sieve to remove water molecules from the solvent. In an alternative method, a chemical drying approach may be used.

Use of the embodiments advantageously provides an apparatus and methods for providing release of a MEMS structure from a sacrificial layer, while reducing or eliminating the stiction and structure collapse problems observed in prior approaches. The use of a recirculating solvent in a dehydration apparatus provides fresh solvent to the devices so that the solvent may be recycled, reducing waste. The embodiments effectively eliminate or greatly reduce the stiction problems associated with the MEMS micro-structure release, without the need for additional chemicals or additional process stages, and implementing the embodiments is efficient and low in cost, and requires no redesign of devices, and is compatible with commercially available semiconductor processing equipment and commonly used process chemicals.

In an embodiment, an apparatus is disclosed including a vessel configured to receive an organic solvent; a wafer handler configured to transfer at least one semiconductor wafer including a MEMS device into the vessel; a dehydration apparatus coupled in a recirculation path with the vessel; and a water content monitor indicating when water content of the organic solvent is less than a predetermined threshold. In a further embodiment, in the above apparatus, the organic solvent is one selected from the group consisting essentially of isopropyl alcohol and methyl alcohol. In yet another embodiment, in the above apparatus, the organic solvent is isopropyl alcohol. In still another embodiment, in the above apparatus, the dehydration apparatus comprises a molecular sieve configured to adsorb water. In still another embodiment, the molecular sieve is configured to remove water to less than about 300 parts per million.

In a further embodiment, in the above apparatus, the water content monitor further comprises a real time monitor. In another embodiment, water content monitor further comprises an infrared detector. In still another embodiment, in the above apparatus, the wafer handler is configured to transport a plurality of semiconductor wafers disposed in a wafer cassette into and out of the vessel. In a further alternative embodiment, in the above apparatus, the vessel is configured to heat the organic solvent.

In another embodiment, a method includes providing a substrate including at least one MEMS device supported by a sacrificial layer; performing an etch in solution to remove the sacrificial layer from the at least one MEMS device; immersing the substrate including the at least one MEMS device in an organic solvent; and while the substrate is immersed in the organic solvent, removing water from the organic solvent until the water remaining in the organic solvent is less than a predetermined threshold. In still a further embodiment, the method includes removing the substrate from the organic solvent and performing a clean on the substrate in oxygen plasma. In still another embodiment, immersing the substrate including the at least one MEMS device in the organic solvent further comprises providing a solvent that is one selected from the group consisting essentially of isopropyl alcohol and methyl alcohol. In yet another embodiment, performing the etch in solution comprises performing an HF etch. In still another embodiment, performing the HF etch further comprises performing the etch using an HF etch having a HF:H2O ratio of about 1:1 or less. In still another embodiment, the sacrificial layer is one selected from the group consisting essentially of an oxide and a nitride.

In another embodiment, a method for performing release of a MEMS device from a sacrificial layer includes forming a micro-structure on a semiconductor wafer, the micro-structure supported by a sacrificial oxide layer; etching the sacrificial oxide layer from the micro-structure using an HF etch solution; immersing the semiconductor wafer including the micro-structure in an organic solvent; while immersing the semiconductor wafer in the organic solvent, dehydrating the organic solvent to remove water from the organic solvent; and when a predetermined threshold is reached, removing the semiconductor wafer from the organic solvent.

In another embodiment, in the above method, reaching the predetermined threshold further comprises immersing the semiconductor wafer in the organic solvent for a predetermined process time. In a further embodiment, reaching the predetermined threshold further comprises measuring water content of the recirculating organic solvent and immersing the semiconductor wafer until the water content is less than about 5%. In still another embodiment, in the above method, reaching the predetermined threshold further comprises measuring water content of the recirculating solvent and immersing the semiconductor wafer until the water content is less than about 300 parts per million. In a further alternative embodiment, in the above method, dehydrating further comprises recirculating the organic solvent through a molecular sieve apparatus configured to remove water.

Although the example embodiments have been described in detail, it should be understood that various changes, substitutions and alterations can be made herein without departing from the spirit and scope of the application as defined by the appended claims. For example, different materials may be utilized for the conductors, the guard rings, the solder balls, the build up layers, or different methods of formation may be utilized for the various layers of material. These devices, steps and materials may be varied while remaining within the scope of the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A method, comprising:
   providing a substrate including at least one MEMS device supported by a sacrificial layer;
   performing an etch in solution to remove the sacrificial layer from the at least one MEMS device;
   immersing the substrate including the at least one MEMS device in an organic solvent; and
   while the substrate is immersed in the organic solvent, removing water from the organic solvent until the water remaining in the organic solvent is less than a predetermined threshold.

2. The method of claim 1, and further comprising:
   removing the substrate from the organic solvent and performing a clean on the substrate in an oxygen plasma.

3. The method of claim 1, wherein immersing the substrate including the at least one MEMS device in the organic solvent further comprises providing a solvent that is one selected from the group consisting essentially of isopropyl alcohol and methyl alcohol.

4. The method of claim 1 wherein performing the etch in solution comprises performing an etch using a solution containing flourine.

5. The method of claim 4 wherein performing the etch further comprises performing the etch using an HF etch solution having a HF:H2O ratio of about 1:1 or less.

6. The method of claim 1, wherein the sacrificial layer is one selected from the group consisting essentially of an oxide and a nitride.

7. A method for performing release of a MEMS device from a sacrificial layer, comprising:
   forming a micro-structure on a semiconductor wafer, the micro-structure supported by a sacrificial oxide layer;
   etching the sacrificial oxide layer from the micro-structure using an HF etch solution;
   immersing the semiconductor wafer including the micro-structure in an organic solvent;
   while immersing the semiconductor wafer in the organic solvent, recirculating and dehydrating the organic solvent to remove water from the organic solvent; and
   when a predetermined threshold is reached, removing the semiconductor wafer from the organic solvent.

8. The method of claim 7, wherein reaching the predetermined threshold further comprises immersing the semiconductor wafer in the organic solvent for a predetermined process time.

9. The method of claim 7, wherein reaching the predetermined threshold further comprises measuring water content of the recirculating organic solvent and immersing the semiconductor wafer until the water content is less than about 5%.

10. The method of claim 7, wherein reaching the predetermined threshold further comprises measuring water content of the recirculating organic solvent and immersing the semiconductor wafer until the water content is less than about 300 parts per million.

11. The method of claim 7, wherein recirculating and dehydrating further comprises recirculating the organic solvent through a molecular sieve apparatus configured to remove water.

12. An method, comprising:
transferring at least one semiconductor wafer including a MEMS device into a vessel configured to receive an organic solvent;
immersing the at least one semiconductor wafer in an organic solvent;
removing water content from the organic solvent using a dehydration apparatus coupled in a recirculation path with the vessel; and
determining when the water content of the organic solvent is less than a predetermined threshold.

13. The method of claim 12, further comprising passing the organic solvent through a molecular sieve configured to adsorb water.

14. The method of claim 12, further comprising monitoring the water content in real time.

15. The method of claim 12, further comprising monitoring the water with an infrared detector.

16. The method of claim 12, further comprising transporting a plurality of semiconductor wafers disposed in a wafer cassette into and out of the vessel.

17. The method of claim 12, further comprising heat the organic solvent.

18. The method of claim 12, further comprising removing the semiconductor wafer from the organic solvent and performing a clean on the semiconductor wafer in an oxygen plasma.

19. The method of claim 12, wherein the organic solvent is recirculated in the recirculating path and further comprising measuring water content of the recirculating organic solvent and immersing the semiconductor wafer until the water content is less than about 5%.

20. The method of claim 12, further comprising measuring water content of the recirculating organic solvent and immersing the semiconductor wafer until the water content is less than about 300 parts per million.

* * * * *